United States Patent
Nakasugi et al.

(12) 
(10) Patent No.: US 6,737,658 B1
(45) Date of Patent: May 18, 2004

(54) PATTERN OBSERVATION APPARATUS AND PATTERN OBSERVATION METHOD

(75) Inventors: Tetsuro Nakasugi, Yokohama (JP); Toru Koike, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 240 days.

(21) Appl. No.: 09/669,732

(22) Filed: Sep. 26, 2000

(30) Foreign Application Priority Data

Sep. 27, 1999 (JP) .............................. 11-273216

(51) Int. Cl.[7] .............................................. H01J 37/302
(52) U.S. Cl. .................................................. 250/492.22
(58) Field of Search .......................... 250/492.22, 310, 250/492.2, 491.1; 324/751; 356/401; 358/461

(56) References Cited

U.S. PATENT DOCUMENTS

| | | | | |
|---|---|---|---|---|
| 5,093,572 A | * | 3/1992 | Hosono | 250/310 |
| 6,128,089 A | * | 10/2000 | Ausschnitt et al. | 356/401 |
| 6,157,087 A | * | 12/2000 | Zhao et al. | 257/797 |
| 6,172,365 B1 | * | 1/2001 | Hiroi et al. | 250/310 |
| RE37,560 E | * | 2/2002 | Elings | 310/316.01 |
| 6,344,750 B1 | * | 2/2002 | Lo et al. | 324/751 |

OTHER PUBLICATIONS

Koike, T. et al., "Investigation of Scanning Electron Microscope Overlay Metrology", Japanese Journal Of Applied Physics, vol. 38, pp. 7159–7163, (1999).

Ura, K., "Contrast Mechanism of Negatively Charged Insulators in Scanning Electron Microscope", Journal of Electron Microscopy, vol. 47, No. 2, pp. 143–147, (1998).

* cited by examiner

*Primary Examiner*—John R. Lee
*Assistant Examiner*—Phillip A Johnston
(74) *Attorney, Agent, or Firm*—Finnegan, Henderson, Farabow, Garrett & Dunner, L.L.P.

(57) ABSTRACT

A first beam radiation is effected by uniformly radiating an electron beam on a vicinity of an underlying mark formed on a sample. The underlying mark is formed of a material with an emission efficiency of secondary electrons different from that of the other part of the sample. Thus, a surface of the sample is charged. A second beam radiation is effected by radiating an electron beam under conditions different from those of the first beam radiation, thereby scanning the mark. Secondary electrons from the surface of the sample are detected to determined the mark position. On the basis of the mark position, an alignment exposure is effected.

10 Claims, 11 Drawing Sheets

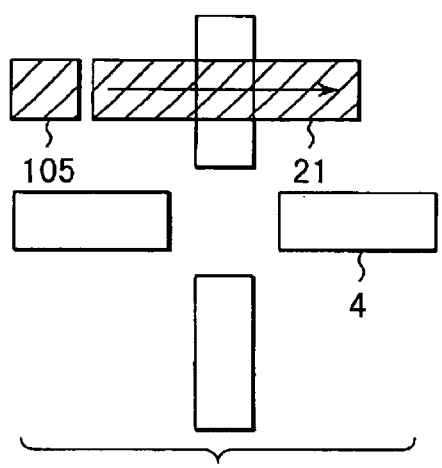
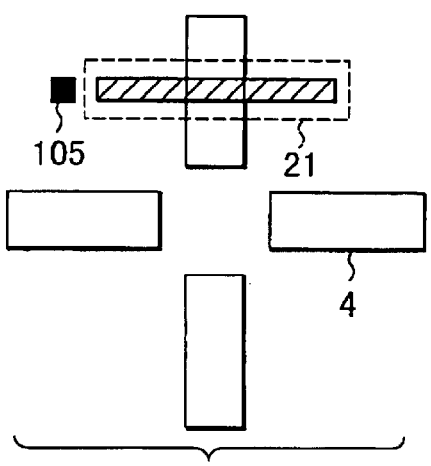
FIG. 6A    FIG. 6B
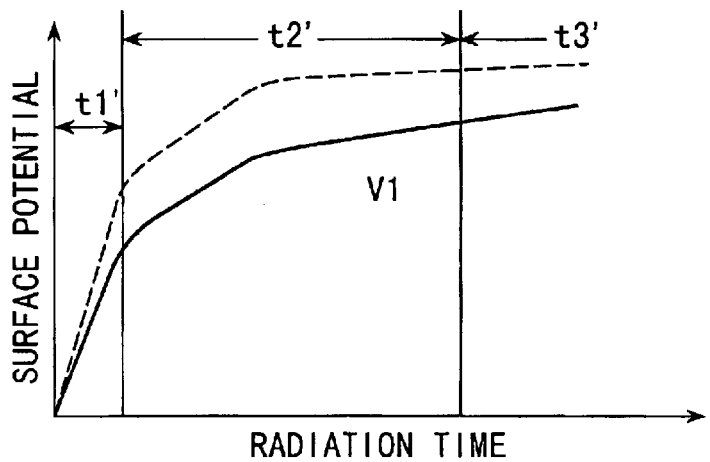
FIG. 7
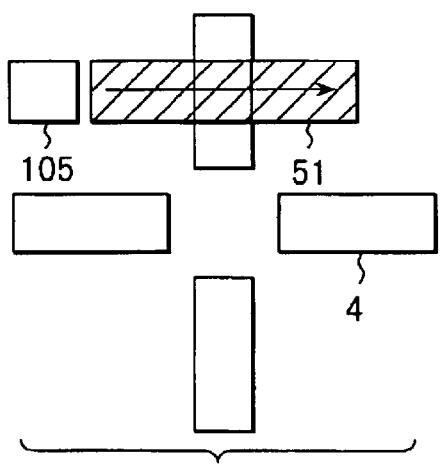
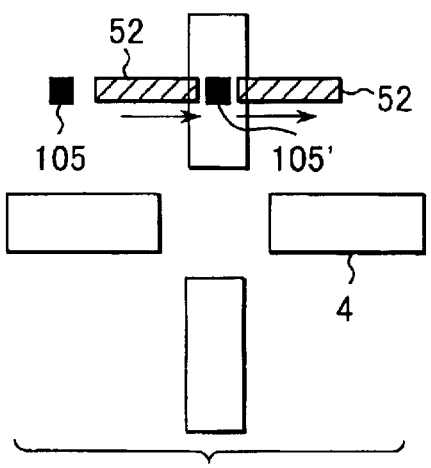
FIG. 8A    FIG. 8B

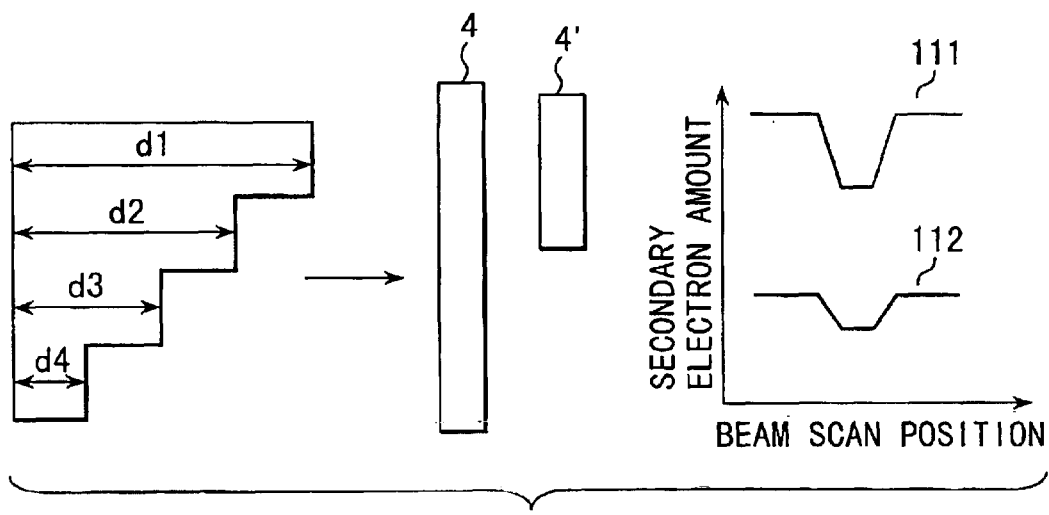
FIG. 15A
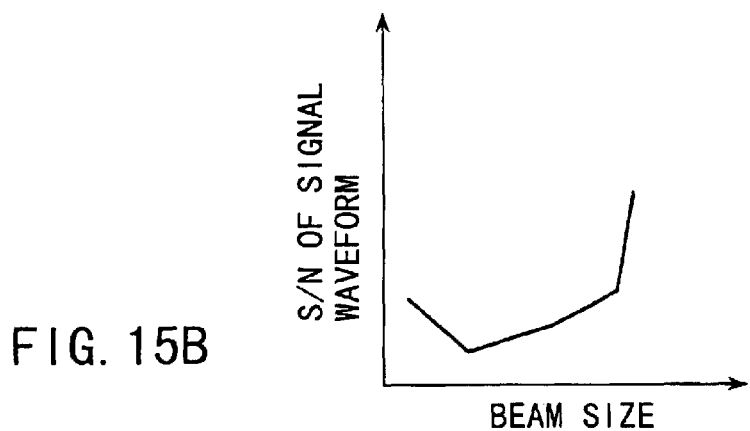
FIG. 15B
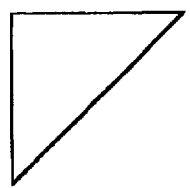 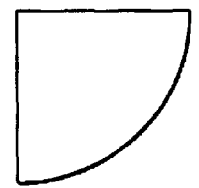
FIG. 15C     FIG. 15D

US 6,737,658 B1

PATTERN OBSERVATION APPARATUS AND PATTERN OBSERVATION METHOD

CROSS-REFERENCE TO RELATED APPLICATIONS

This application is based upon and claims the benefit of priority from the prior Japanese Patent Application No. 11-273216, filed Sep. 27, 1999, the entire contents of which are incorporated herein by reference.

BACKGROUND OF THE INVENTION

The present invention relates to a pattern observation method for performing a pattern observation using a charged particle beam.

FIG. 1 illustrates a technical concept of a conventional alignment exposure using an electron beam.

As is shown in FIG. 1, a sample to be aligned is formed such that an insulator film 102 and a resist 103 are provided on a silicon substrate 101. An underlying mark 104 is formed in the insulator film 102 on a surface of the silicon substrate 101.

An electron beam 105 is made to scan the underlying mark 104 located at a deep position from the surface of the resist 103. Reflected electrons 106 from the underlying mark 104 is detected by a detector 107. Based on a detection signal, alignment exposure is carried out. However, when the energy of the electron beam 105 is low, the range of electrons is short. Consequently, the electrons cannot reach the underlying mark located at a deep position from the surface of the resist 103.

In order to solve this problem, an alignment exposure method as illustrated in FIGS. 2A to 2D has been proposed. FIG. 2A illustrates a technical concept of the alignment exposure. A sample to be aligned is the same as shown in FIG. 1.

An electron beam 105 having a predetermined acceleration voltage is radiated on an underlying mark 104. Thereby, a charged portion 112 created by the electron beam 105 appears on the surface of the sample. A difference between electrostatic capacitances 113 and 114 occurs between a region where the mark 104 is formed at a deep position from the surface of the sample and a region where it is not formed, due to an unevenness or a nonuniformity in material of a pattern. The difference in electrostatic capacitance causes a surface potential difference in the charged portion 112 on the surface of the sample.

The surface potential difference appears as a voltage contrast image of secondary electrons 115 at the time of the radiation of the electron beam 105. The contrast image is detected by the detector 107. Thus, the position of the underlying mark 104 can be detected and the alignment in the electron beam exposure can be effected.

FIG. 2B shows a surface potential of the sample in a case where the sample is charged with positive electricity. A region where the surface potential is high corresponds to the portion at which the underlying mark 104 is formed. FIG. 2C shows a secondary electron waveform based on the surface potential difference of the sample in a case where the sample is charged with positive electricity. A region where the amount of secondary electrons greatly decreases corresponds to the portion at which the underlying mark 104 is formed.

If the same charging phenomenon is utilized, a misalignment measurement in a lithography step of a semiconductor fabrication process can be carried out using a scanning electron microscope (SEM). FIGS. 3A and 3B illustrate a technical concept of a misalignment measurement utilizing the charging phenomenon. FIG. 3A is a plan view of misalignment measuring marks, and FIG. 3B is a cross-sectional view of the misalignment measuring marks. In FIGS. 3A and 3B, reference numeral 151 denotes a silicon substrate, 152 a silicon nitride film, 153 a silicon oxide film, 154 an anti-reflection film, 156 a first mark formed on the underlying silicon substrate, and 157 a second mark formed of photoresist. The first mark 156 is formed by removing portions of the silicon substrate and silicon nitride film. The silicon oxide film 153 is formed over the entire surface of the substrate such that the first marks 156 are buried. A top surface of the silicon oxide film 153 is flattened by chemical mechanical polishing (CMP). A misalignment inspection is performed by scanning an electron beam across the first mark 156 and second mark 157. A scanning path is indicated by an arrow 158 in FIG. 3A. Thus, a signal waveform of secondary electrons having peaks near the first mark 256 and second mark 157 can be obtained.

The above method, however, has the following problem.

FIG. 2D is a view for explaining the problem with the conventional alignment method utilizing the charging phenomenon. Specifically, FIG. 2D illustrates a relationship between a radiation time and a surface potential of a sample. Assume that the sample is charged with positive electricity. A solid line indicates a surface potential of a region where the underlying mark 104 is not formed, and a broken line indicates a surface potential of a region where the underlying mark 104 is formed. In order to enhance a signal-to-noise ratio (S/N) at a position of the underlying mark 104 for alignment, it is necessary to scan the beam over the underlying mark 104 several times and to average and add the detection signals.

However, the aforementioned phenomenon utilizing the charging is a temporally transient one, as shown in FIG. 2D. When the radiation time is divided into time periods t1 to t3, a sufficient surface potential difference is obtained in radiation time period t2 and a mark image with full contrast can be observed in this radiation time period.

In radiation time period t3, the charge is excessively high. As a result, only a small surface potential difference is obtained, and a mark image becomes difficult to observe. By contrast, in radiation time period t1, the amount of the radiation beam is small and the charging phenomenon itself will hardly occur. In this time period, it is difficult to observe the mark image. On the other hand, if the beam current for observing the mark image is too high, excessive charging occurs in a short time and the length of the time period t2 in which the mark image can be observed is decreased. If the beam current for observing the mark image is too low, the length of the time period t1 in which the mark image cannot be observed is increased and quick observation of the mark image cannot be carried out.

The optimal condition for mark detection varies depending on the thickness and kind of the insulator film formed over the underlying mark 104. However, as is understood from the above-described problem, it is difficult, in fact, to set the condition for image observation. The same problem as with the alignment exposure also arises in the misalignment measurement as illustrated in FIGS. 3A and 3B.

Another problem with the alignment exposure will now be described.

In usual cases, when alignment exposure is performed, an electron beam is scanned in a single direction to detect the mark on the sample. When the electron beam is scanned, all secondary electrons produced by the radiated electron beam do not enter the detector. In addition, where the surface of the sample has been charged with the electron beam radiated immediately before, such a phenomenon occurs that the secondary electrons re-enter, in particular, the surface of the sample. If the detected secondary-electron image is observed, a dark portion appears on a peripheral portion of the pattern. This is due to the re-entrance of secondary electrons.

If this problem is studied in greater detail, it is understood that the secondary electrons re-entering the surface of the sample travel asymmetrically. Specifically, if an electron beam is scanned in a single direction, the electron beam radiated immediately before charges the surface of the sample negatively, on which the electron beam has been radiated immediately before. On the other hand, the surface of the sample, which has not yet been scanned by the electron beam, is less charged. If this phenomenon is left as it is, the detected secondary-electron signal waveform becomes asymmetric, and a read error of the mark position will occur. Of course, this problem applies to the misalignment measurement.

As has been described above, in the conventional alignment method for the electron beam exposure, the mark located at a deep position from the surface of the resist can be made detectable by utilizing the charging phenomenon. However, the charging phenomenon will easily vary with the passing of time, and it is difficult to precisely detect the mark. Similarly, in the misalignment measurement utilizing the charging phenomenon, it is difficult to precisely detect the mark.

In addition, because of the kind of the method of scanning the electron beam in the alignment measurement, the secondary-electron signal waveform becomes asymmetric, and a read error of the mark position will occur.

BRIEF SUMMARY OF THE INVENTION

The object of the present invention is to provide a pattern observation apparatus and a pattern observation method capable of detecting or measuring an alignment mark with higher precision.

According to an aspect of the present invention, there is provided a pattern observation apparatus for observing a pattern by radiating a charged particle beam on a sample in which the pattern is formed on a substrate and a first film is formed on the substrate including the pattern, the apparatus comprising: a first beam radiation section for performing a first charged particle beam radiation on the sample including the pattern, and charging a surface of the sample; a second beam radiation section for scanning the charged particle beam over the pattern under conditions different from conditions for the first charged particle beam radiation; and an observation section for observing the pattern by detecting secondary electrons from the surface of the sample.

In this invention, the beam radiation step for pattern detection is divided into a first beam radiation step and a charged particle beam scanning step. The sample surface is charged with the first beam radiation, and the charged particle beam is scanned to acquire a pattern image on the sample surface. Thereby, high-precision pattern detection can be performed. Specifically, since the first film surface near the pattern formed on the substrate is sufficiently charged by the first beam radiation, an adequate contrast is produced between the portion on the pattern and the other portion. Accordingly, where the pattern image is obtained by the scan of the charged particle beam, high-precision pattern detection can be performed. In particular, detection of the pattern is not performed in the undesirable condition with a low potential contrast due to deficient charging. The pattern detection according to this invention is applicable to both the alignment exposure and misalignment measurement.

The sample is charged in the following method. FIG. 13 shows an example of the relationship between the acceleration voltage of the electron beam and the emission efficiency of secondary electrons. In this case, the sample is a resist, the abscissa indicates the acceleration voltage, and the ordinate indicates the emission efficiency of secondary electrons from the sample surface. The resist is positively charged with the range of the acceleration voltage between 400V and 1000V so that the emission efficiency of secondary electrons emitted from the surface may exceed 1.

On the other hand, if the acceleration voltage is less than 400V or more than 1000V, the emission efficiency of secondary electrons decreases below 1 and the sample is negatively charged. Specifically, in order to positively charge the sample, the acceleration voltage needs to be chosen from the range of about 400V to 1000V. In order to negatively charge the sample, the acceleration voltage needs to be chosen out of this range. The range of acceleration voltage in which the emission efficiency of secondary electrons exceeds 1 varies depending on samples, but the relationship between the acceleration voltage and the secondary electrons is substantially the same.

According to another aspect of the invention, there is provided a pattern observation apparatus comprising: a table generating section for generating a table in which a scan order is associated with scan positions; a charged particle beam scanning mechanism for scanning, according to the table, a charged particle beam over a sample on which a pattern is formed; a detection mechanism for detecting secondary electrons produced from the sample by the scanning of the charged particle beam, and outputting secondary electron detection signals; an image information generating section for rearranging the secondary electron detection signals in association with the scan positions on the basis of the table, thereby generating image information of a surface of the sample; and a pattern position determination section for determining a pattern position on the basis of the image information.

Thus, even if the charged particle beam is made to scan in any scan order, the image of the sample including the pattern can be acquired, and accordingly the pattern can be observed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A and 6B illustrate technical concepts of first and second beam exposures according to the first embodiment;

FIG. 7 shows a relationship between a radiation time and a surface potential of a sample according to the first embodiment;

FIGS. 8A and 8B illustrate technical concepts of first and second beam exposures according to a second embodiment of the present invention;

FIGS. 15A to 15D illustrate a method of optimizing the beam according to the fourth embodiment of the invention;

DETAILED DESCRIPTION OF THE INVENTION

Embodiments of the present invention will now be described with reference to the accompanying drawings.
(First Embodiment)

Figure 4A:
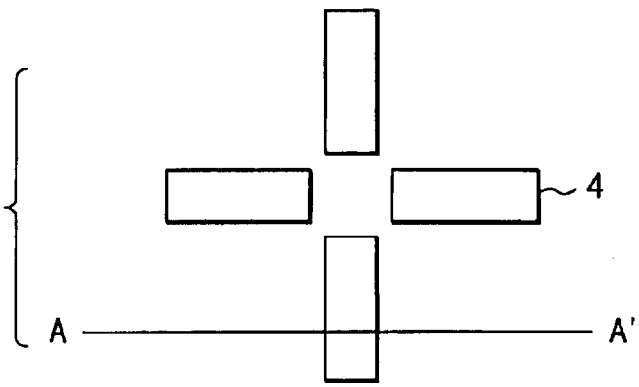
FIGS. 4A and 4B are a plan view and a cross-sectional view showing the structure of a sample to be subjected to an electron beam alignment exposure according to a first embodiment of the present invention.
Figure 4B:
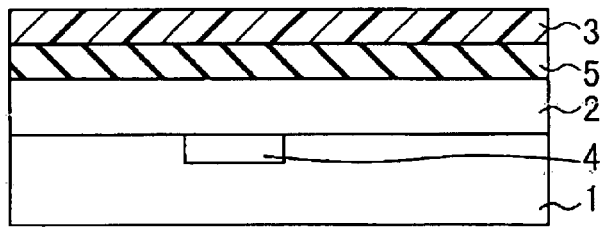

FIGS. 4A and 4B show the structure of a sample to be observed by a pattern observation method according to a first embodiment of the present invention. In this first embodiment and second to fourth embodiments to be described later, the invention is applied to alignment exposure.

FIG. 4A is a plan view of an alignment mark formed on a sample. The alignment mark has four segments. Each segment is a line pattern. The four segment of the alignment mark is placed symmetrically, thereby the alignment mark has a cross shape. FIG. 4B is a cross-sectional view of the sample, taken along line A–A' in FIG. 4A. As is shown in FIG. 4B, a silicon oxide film 2 with a thickness of 1 $\mu$m is formed on a silicon substrate 1. A silicon nitride film with a thickness of 50 nm, which serves as a pattern transfer film 5, is formed on the silicon oxide film 2. A resist 3 with a thickness of 50 nm is formed on the pattern transfer film 5. A recess portion 300 nm deep is formed in the silicon substrate 1 by plasma etching. A material different from the material of the silicon substrate 1 (e.g. a silicon oxide film) is buried in this recess portion. Thereby, underlying mark 4 is formed.

Figure 5:
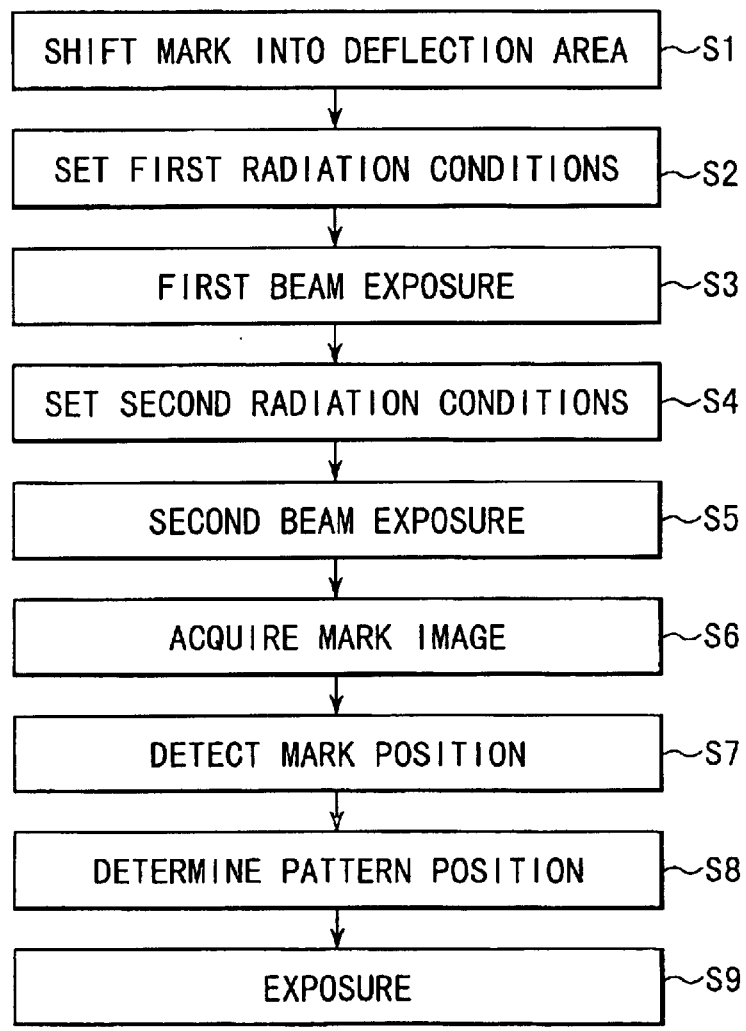
FIG. 5 is a flow chart illustrating the electron beam alignment exposure according to the first embodiment of the invention.

A charged particle beam alignment method, which is carried out on the sample shown in FIGS. 4A and 4B, will now be described with reference to a flow chart of FIG. 5.

A sample to be subjected to alignment exposure is conveyed onto a sample stage of an electron beam exposure apparatus (not shown). The electron beam exposure apparatus used in the present embodiment has an acceleration voltage of, e.g. 1 kV, and includes two-stage electrostatic deflectors, i.e. a main electrostatic deflector and a sub-electrostatic deflector. A main deflection width and a sub-deflection size are 1500 $\mu$m and 50 $\mu$m, respectively. In the case of using the present apparatus, if the thickness of the resist film is set at 50 nm or less, a resist pattern with a vertical cross section can be formed even where the acceleration voltage for the electron beam emitted from an electron gun is about 1 kv. The maximum beam size is 10 $\mu$m and the current density is 1A/cm$^2$.

On the other hand, a control computer (not shown) provided in the electron beam exposure apparatus stores data on the position of the underlying mark 4 on the sample. On the basis of the stored positional data on the sample, the underlying mark 4 is moved to the center of the beam deflection area which the electron beam exposure apparatus has (S1).

In order to perform first beam radiation, the conditions for the first beam radiation are set (S2). Specifically, the beam size is set at 10 $\mu$m, the beam radiation time per shot is set at 500 ns, and the amplifier setting time is set at 100 ns. In addition, multiple exposure is performed. The total exposure amount in the multiple exposure is set at 20 $\mu$C/cm$^2$.

On the basis of the above conditions for the first beam radiation, the first beam radiation is performed (S3). FIG. 6A illustrates the technical concept of the first beam radiation. In the first beam radiation, an electron beam 105 is radiated on a predetermined beam radiation area 21 including the underlying mark 4. With the beam radiation, a surface portion of the resist which overlaps the underlying mark 4 is sufficiently charged. The sufficient charging provides an adequate potential contrast between the portion on the underlying mark 4 and the other portion. The setting time of the amplifier is about 100 ns, but in the first beam radiation the setting of the amplifier need not be considered too much. The first beam radiation aims at charging the portion which overlaps the underlying mark 4, and not at extracting a high-precision signal waveform. Shorter-time, higher-speed beam radiation is performed than in the second beam radiation to be described below. The setting time in this context refers to a time period required until the transient characteristics of the amplifier become negligible from the beginning of the electron beam radiation, where the beam radiation is performed using the electron beam exposure apparatus. At the time of the first beam radiation, beam radiation areas do not overlap.

Subsequently, in order to perform the second beam radiation, the conditions for the second beam radiation are set (S4). Specifically, the beam size is set at 0.1 $\mu$m, less than in the first radiation. The beam radiation time is set at 200 ns, shorter than in the first radiation. By increasing the beam radiation time, the sufficient amplifier setting time is provided. As a result, the precision in subsequent detection of the mark is enhanced. In this case, the amplifier setting time is set at 300 ns. The amount of electrons per unit time, which are radiated on the sample surface by the first beam radiation, is set to be greater than the amount of electrons per unit time which are radiated on the sample surface by the second beam radiation. The unit time, in this context, refers to a sum of the beam radiation time per shot and the amplifier setting time.

On the basis of the above conditions for the second beam radiation, the second beam radiation is performed (S5). The second beam radiation aims at detecting mark image. In the second beam radiation, the underlying mark 4 is scanned by the electron beam. FIG. 6B illustrates the technical concept of the second beam radiation. The electron beam 105 is made to scan a narrow beam radiation area 22 defined by a beam with a small beam width, so as to cross part of the underlying mark 4. For the purpose of reference, in FIG. 6B, the beam radiation area 21 for the first beam radiation is indicated by a broken line. It is thus understood that the second beam radiation area 22 is narrower than the first beam radiation area 21.

After the second beam has been radiated, the mark image is detected using a detector (not shown). The detected signal waveform is subjected to an averaging/adding process. As a result, the mark image obtained (S6). At the time of detecting the mark image, that is, immediately after the second beam radiation, the portion of the resist surface which overlaps the underlying mark 4 has already been sufficiently charged by the first beam radiation. Accordingly, an adequate contrast is produced between the portion on the underlying mark 4 and the other portion. As a result, high-precision mark image detection can be performed. In particular, detection of the mark image is not performed in the undesirable condition with a low potential contrast due to deficient charging. In the above description, one side of the segment of the cross-shaped alignment mark is used for mark detection in the X-direction (horizontal direction). The same method is applicable to the detection of the position of the alignment mark by performing the mark position detection in the Y-direction (vertical direction).

On the basis of the obtained mark image, the mark position is detected by the control computer of the electron beam exposure apparatus (S7). All sides of the segments formed on the sample are subjected to steps S1 to S7, and the position of the pattern to be exposed is determined on the basis of the calculated information on the mark position (S8). Pattern exposure is performed with an acceleration voltage of 1 kv at the determined pattern position (S9).

FIG. 7 shows the relationship between an electron beam radiation time and a sample surface potential in the mark detection in the above-described process. In this embodiment, since the acceleration voltage is 1 kV, the resist surface is positively charged. A solid line indicates a surface potential of a portion where the underlying mark 4 is not formed, and a broken line indicates a surface potential of a portion where the underlying mark 4 is formed. Where time 0 is a start time of the first beam radiation and the radiation time is divided into t1', t2' and t3', a sufficient surface potential difference appears in the time t2'. At this time, an image can be observed with an adequate contrast.

Figure 1:
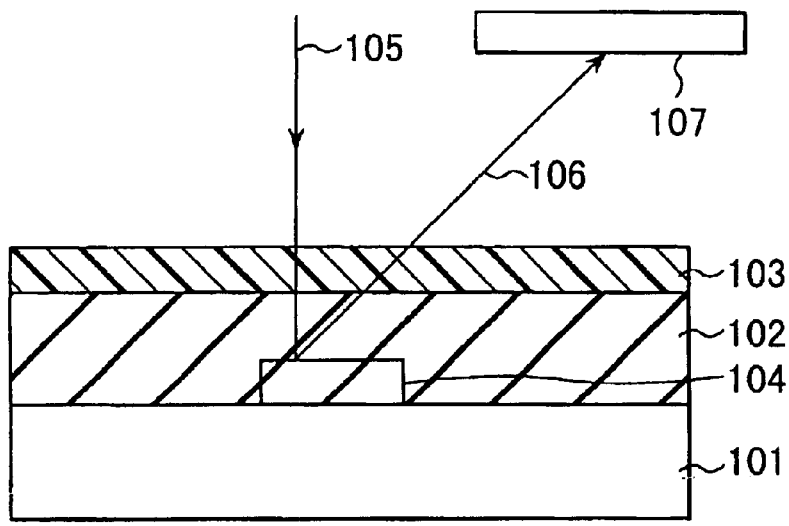
FIG. 1 illustrates a technical concept of a conventional alignment exposure using an electron beam.
Figure 3A:
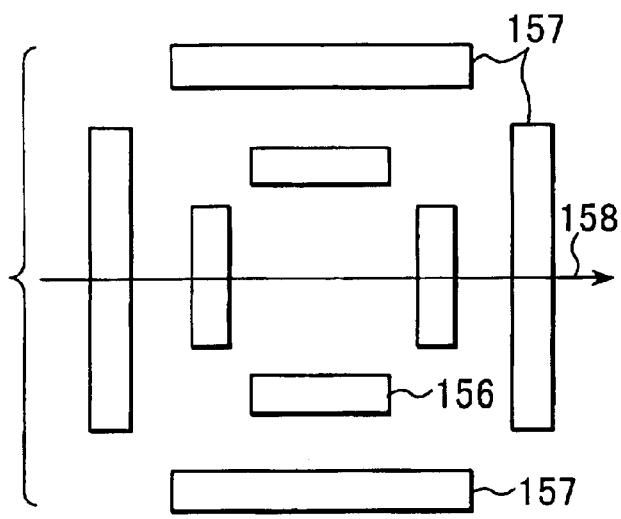
FIGS. 3A and 3B illustrate a technical concept of a conventional misalignment measurement utilizing a charging phenomenon.
Figure 3B:
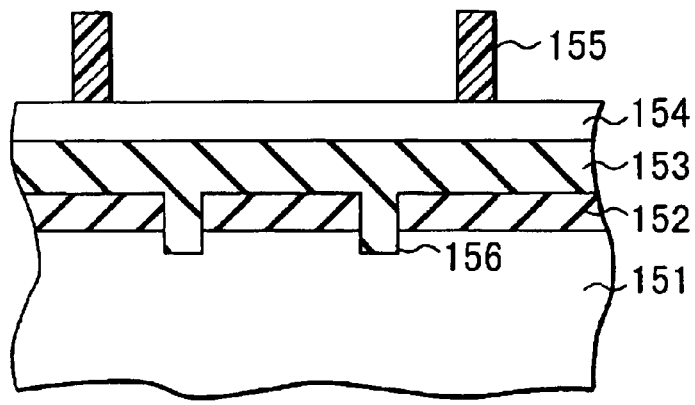
Figure 2A:
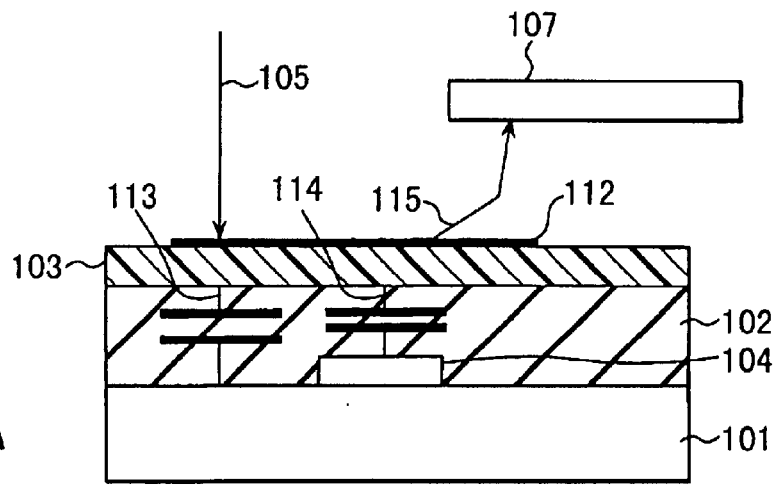
FIGS. 2A to 2D are views for explaining a conventional alignment exposure utilizing a charging phenomenon.
Figure 2B:
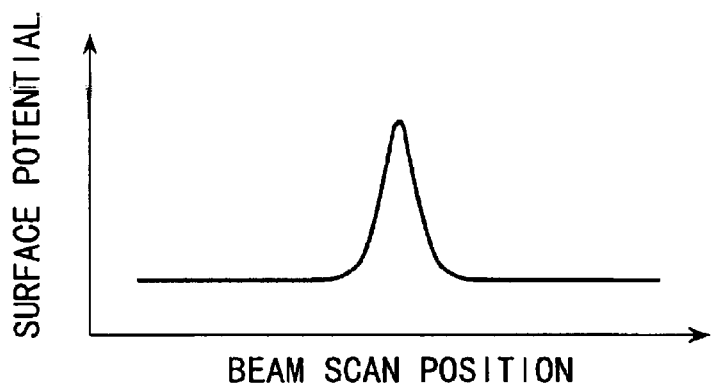
Figure 2C:
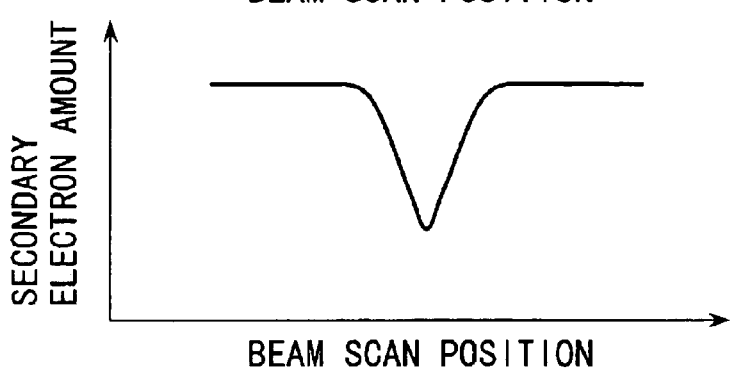
Figure 2D:
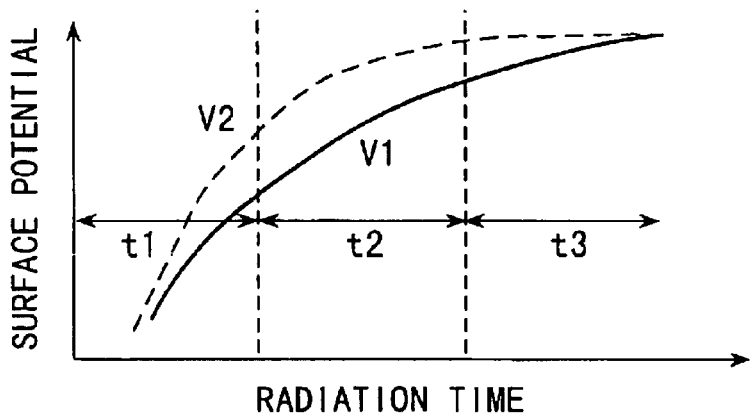

As is understood when FIG. 7 is compared with FIG. 2D showing the prior-art method, the time t1' needed to sufficiently charge the sample and obtain an adequate surface potential difference in this embodiment is shorter than the time (t1) in the prior art. This is because the first beam radiation is performed at very high speed. On the other hand, the time t2' in which the image can be observed is much longer than the time (t2) in the prior art. This is because the amount of electrons per unit time, which are radiated on the sample surface by the second beam radiation, is set to be less than the amount of electrons per unit time, which are radiated on the sample surface by the first beam radiation. In addition, since the first beam radiation area is sufficiently greater than the second beam radiation area, the second beam radiation area and the vicinity thereof is uniformly charged. As a result, high-precision mark position detection can be performed.

As has been described above, the beam radiation step is divided into a first beam radiation step and a second beam radiation step. The sample surface is charged with the first beam radiation, and the beam is scanned by the second beam radiation to acquire the mark image on the sample surface. Thereby, high-precision mark image detection can be performed. Specifically, since the portion of the resist surface which overlaps the underlying mark is sufficiently charged by the first beam radiation, an adequate contrast is produced between the portion on the mark and the other portion. Accordingly, where the mark image is obtained by the second beam radiation, high-precision mark image detection can be performed. In particular, detection of the mark image is not performed in the undesirable condition with a low potential contrast due to deficient charging.

Moreover, since the first beam radiation is performed at high speed, the mark image can be obtained more quickly than in the prior art. As a result, high-precision, high-speed alignment exposure can be performed.

In the above-described embodiment, in the first beam radiation and the second beam radiation, the beam size and beam scan speed are varied. However, the same advantages as described above can be obtained when other parameters such as the beam current density, beam scan position and beam shape are varied.

(Second Embodiment)

A second embodiment of the present invention is a modification of the first embodiment. The second embodiment is characterized in that after the first beam radiation the mark position is approximately detected on the basis of the sample surface potential difference, and on the basis of the mark position the second beam radiation is performed. A detailed description of the steps and apparatus structure common to the first embodiment is omitted. The structure of the electron beam exposure apparatus and the structure of the sample, which are used in the second embodiment, are the same as those in the first embodiment.

A sample to be subjected to alignment exposure is conveyed onto a sample stage of an electron beam exposure apparatus (not shown). On the basis of data on the position of the underlying mark on the sample, which is prestored in the control computer in the electron beam exposure apparatus, the underlying mark 4 is moved to the center of the beam deflection area.

The steps thus far are the same as those in the first embodiment.

Then, in order to perform the first beam radiation, the conditions for the first beam radiation are set. Specifically, the beam radiation time per shot is set at 500 ns, and the amplifier setting time is set at 100 ns. In addition, multiple exposure is performed, and the total exposure amount in the multiple exposure is set at 20 $\mu C/cm^2$. Although these parameters are common to those in the first beam radiation of the first embodiment, the beam size is set at 0.5 μm in the second embodiment, unlike the first embodiment.

On the basis of the above conditions for the first beam radiation, the first beam radiation is performed. FIG. 8A illustrates the technical concept of the first beam radiation. Reference numeral 51 denotes a beam radiation area of the first beam radiation. The electron beam 105 is scanned in the direction of the arrow. There is no overlap of beam radiation areas and the beam radiation is performed at high speed. Since the beam size is 0.5 μm, the mark position can be approximately detected with a positional resolution of 0.5 μm.

Then, secondary electrons from the sample surface charged by the first beam radiation is detected by a detector (not shown), and the mark position is approximately detected from the contrast of the mark image.

Subsequently, the second beam radiation is performed. FIG. 8B illustrates the technical concept of the second beam radiation. Reference numeral 52 denotes a beam radiation area of the second beam radiation. The electron beam 105 is scanned in the direction of the arrow. Like the first embodiment, the beam size for the second beam radiation is set at 0.1 μm and the beam radiation time is set at 200 ns. Thereby, a sufficient amplifier setting time is provided and as a result the beam position precision is enhanced. On the basis of the approximate mark position obtained by the first beam radiation, the beam is scanned over only edge portions of the underlying mark 4.

After the second beam radiation, the mark image is detected using the detector (not shown). The obtained detection signal is subjected to signal processing, thereby obtaining the mark image. On the basis of the obtained mark image, the mark position is calculated. On the basis of the calculated mark position, pattern exposure is effected with an acceleration voltage of 1 kv.

According to the present embodiment, the same advantages as in the first embodiment are obtained. In addition, the following advantages are obtained.

First, over-sensitization of the resist surface can be prevented. This is because the mark position is approximately detected by the first beam radiation and only the edge portions of the underlying mark 4 are scanned by the beam in the second beam radiation. Second, the number of times of beam scan is reduced and the mark detection speed is increased. This is because only the edge portions are scanned by the beam.

(Third Embodiment)

A third embodiment of the present invention relates to a modification of the second embodiment. In this embodiment, it is assumed that the acceleration voltage is 5 kV and the sample surface is negatively charged. The third embodiment is characterized in that beam scanning is performed alternately at symmetrical positions with respect to the underlying mark 4. The third embodiment is common to the second embodiment in that the mark detection is performed by the first beam radiation and second beam radiation.

In the first beam radiation step, like the second embodiment, the beam size is set at 0.5 μm and the area on the underlying mark 4 is uniformly radiated. In this case, beam radiation areas do not overlap. The conditions for the first beam radiation are set such that the beam radiation time per shot is set at 500 ns, and the amplifier setting time is set at 100 ns. In addition, multiple exposure is performed, and the total exposure amount in the multiple exposure is set at 20 μC/cm². Thereby, high-speed beam radiation is realized. A mark image is obtained by the first beam radiation. Based on the contrast of the obtained mark image, the mark position is approximately detected.

Then, the second beam radiation is performed. In the second beam radiation, the beam size is set at 0.1 μm and the electron beam is let to scan over the mark. The beam radiation time is set at 200 ns and a sufficient amplifier setting time is provided to enhance the precision of the beam position.

Figure 9A:
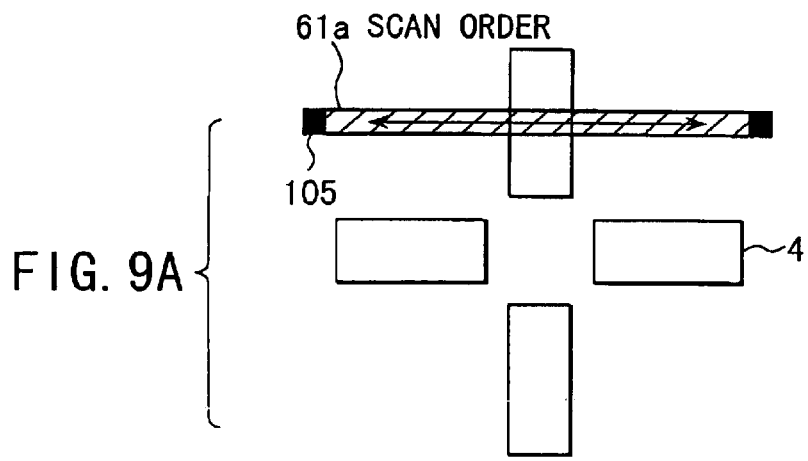
FIGS. 9A to 9C illustrate a technical concept of a second beam radiation according to a third embodiment of the present invention.

FIG. 9A illustrates the technical concept of the second beam radiation according to this embodiment. Reference numerals 61a and 61b denote beam radiation areas, and the beam is scanned alternately in the directions of the double-headed arrow. For example, the beam is scanned from the beam radiation area 61a to the beam radiation area 61b, and then the beam is scanned from the beam radiation area 61b to the beam radiation area 61a in the reverse direction. The beam radiation areas 61a and 61b are symmetric with respect to the mark position. The repetition of the beam scanning characterizes the present embodiment.

A signal detected from the sample surface by the second beam radiation is subjected to an averaging/adding process, thereby acquiring the mark image.

On the basis of the obtained mark image, the mark position is calculated by the control computer of the electron beam exposure apparatus (not shown). The above operation is performed for all segments of the mark 4, and on the basis of the acquired mark position information, pattern exposure is effected with the acceleration voltage of 5 kV.

The following advantages to be described below can be obtained by repeating the beam scan alternately and symmetrically with respect to the underlying mark 4.

Figure 10A:
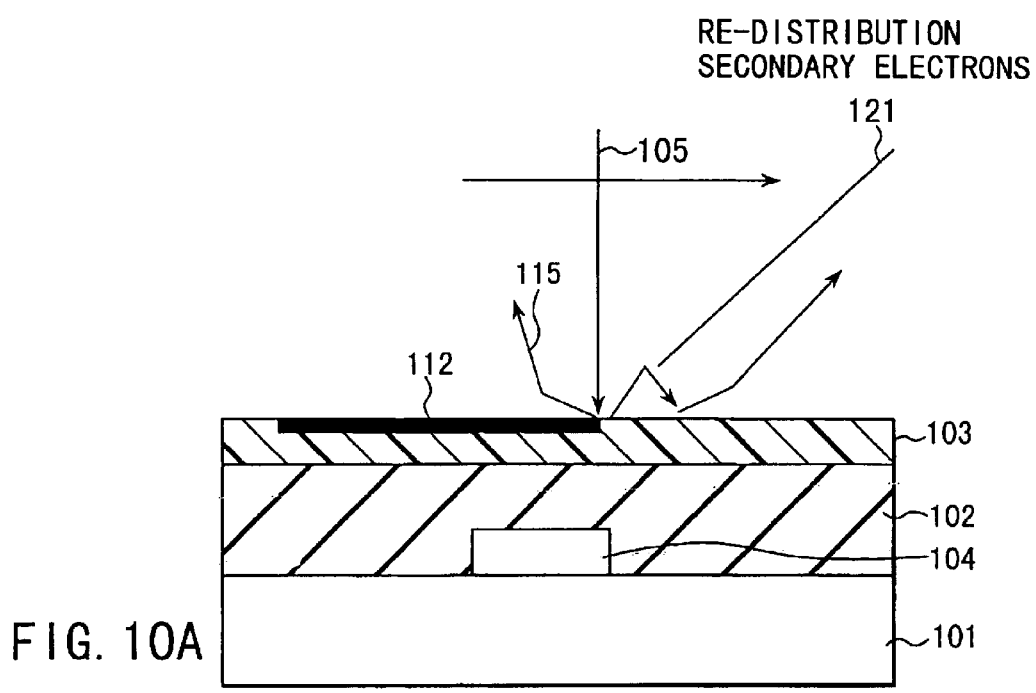
FIGS. 10A to 10C illustrate a problem in a case of scanning a beam in a single direction.
Figure 10B:
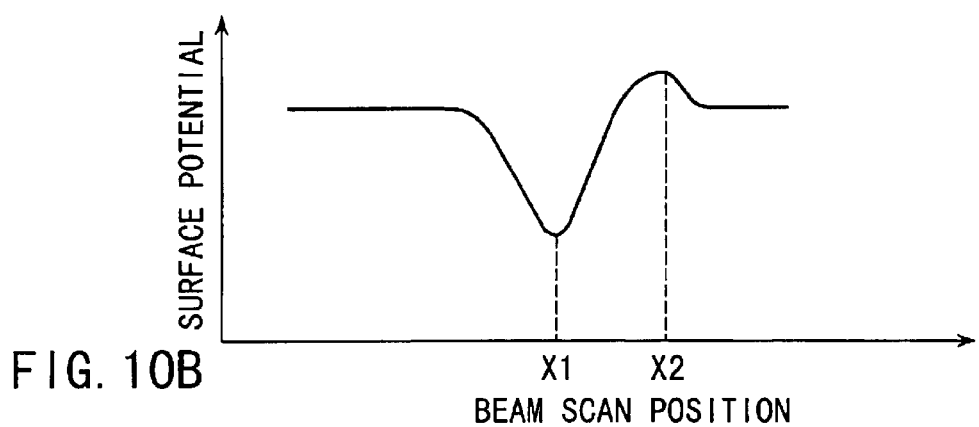
Figure 10C:
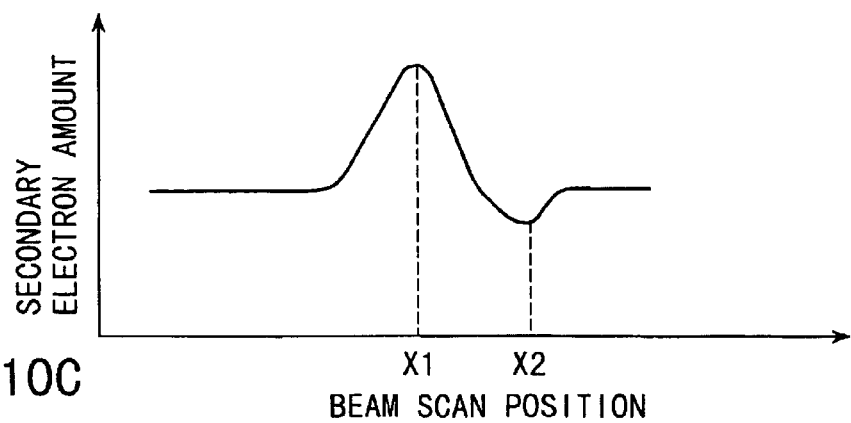

FIGS. 10A to 10C illustrate the technical concept in the case where the beam is scanned in a single direction to detect the mark. As is illustrated in FIG. 10A, there is a difference in surface potential between the mark area, from which secondary electrons 115 are emitted, and the other area. Thus, the secondary electrons emitted by the electron beam radiation include secondary electrons other than the secondary electrons 115 traveling in a direction away from the sample, which are detected by the detector 107. Consequently, such a phenomenon occurs that secondary electrons re-enter the sample surface, as shown in FIG. 10A (hereinafter, this phenomenon is referred to as "re-distribution of secondary electrons"). If re-distribution secondary electrons 121 have reached the sample surface by the re-distribution of secondary electrons, a dark portion appears on a pattern peripheral portion.

FIG. 10B shows the relationship between the beam scan position and the sample surface potential. As is shown in FIG. 10B, the center position surface potential is lowest in a region of a center position x1 of the underlying mark 104. At a position where a distance from the center position x1 is larger than a certain value, the sample surface potential is substantially constant. However, the surface potential relatively increases at a position x2 distanced from the center position x1 in the beam scan direction.

FIG. 10C shows the relationship between the beam scan position and the secondary electron amount. As is shown in FIG. 10C, the amount of secondary electrons increases in a region of the center position x1 of the underlying mark 104, where the surface potential is low, that is, in a region which is negatively charged. However, the amount of secondary electrons decreases in a region of the position x2 distanced from the center position x1 in the beam scan direction, where the surface potential is relatively high. The decreasing amount of secondary electrons are observed as a dark portion if they are detected by the detector 107 (not shown).

The re-distribution secondary electrons 121 travel asymmetrically with respect to the underlying mark 104. The portion on the downstream side of the beam scan direction has already been negatively charged by the radiated electrons. On the other hand, the portion on the upstream side of the beam scan direction has not yet been irradiated by the beam, although it is slightly charged. Accordingly, the amount of charge on the upstream side is smaller than that on the downstream side. As a result, there is a strong possibility that the re-distribution secondary electrons 121 come to the upstream side of the beam scan direction.

This phenomenon will now be considered, assuming that the area near the underlying mark 104 is scanned by the beam. The amount of re-distribution secondary electrons 121 is greater on the upstream side of the underlying mark 104 in the beam scan direction. The re-distribution secondary electrons have an energy of several-ten eV, and the emission efficiency of secondary electrons increases on the portion at which the re-distribution secondary electrons are incident, that is, on the upstream side of the beam scan direction. The emission of secondary electrons serves to decrease negative charging. Accordingly, the surface potential on the upstream side of the beam scan direction becomes has a positive level, and the surface potential becomes asymmetric with respect to the underlying mark 104. Thus, the secondary electron waveform shown in FIG. 10B is asymmetric with respect to the underlying mark 104, and a read error of the mark position will occur.

To solve the above problem, the beam is scanned alternately in a reciprocal manner and symmetrically with respect to the mark. Thereby, the resist surface is uniformly charged, and the direction of traveling of re-distribution secondary electrons becomes uniform. Therefore, asymmetry of the dark portion at the time of mark image detection can be eliminated, and high-precision alignment is realized. The repeated beam scan in the reverse direction does not need to follow the same path. If the asymmetric charging of the sample surface due to the previous scan can be canceled, the repeated beam scan in the reverse direction may follow a path different from that of the previous scan.

Figure 9B:
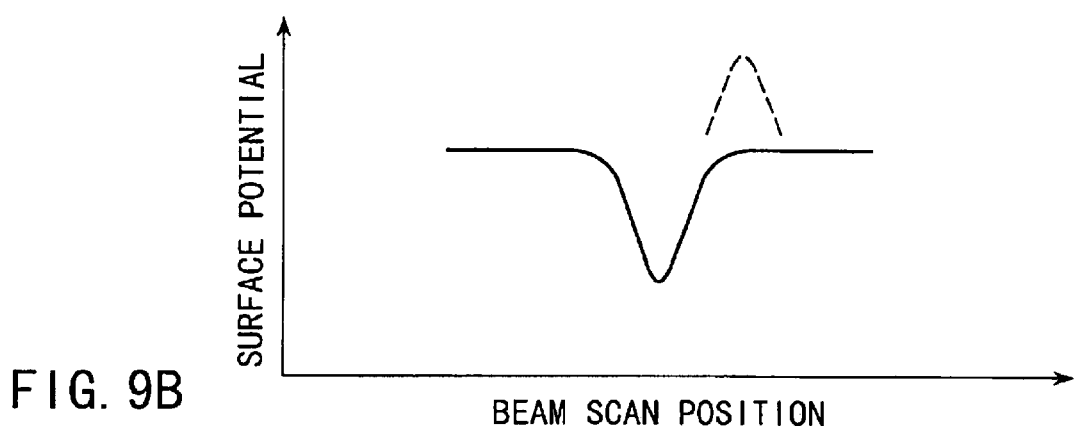

FIG. 9B shows the surface potential of the sample where the sample is negatively charged. A region where the surface potential decreases corresponds to the portion where the underlying mark 104 is formed.

Figure 9C:
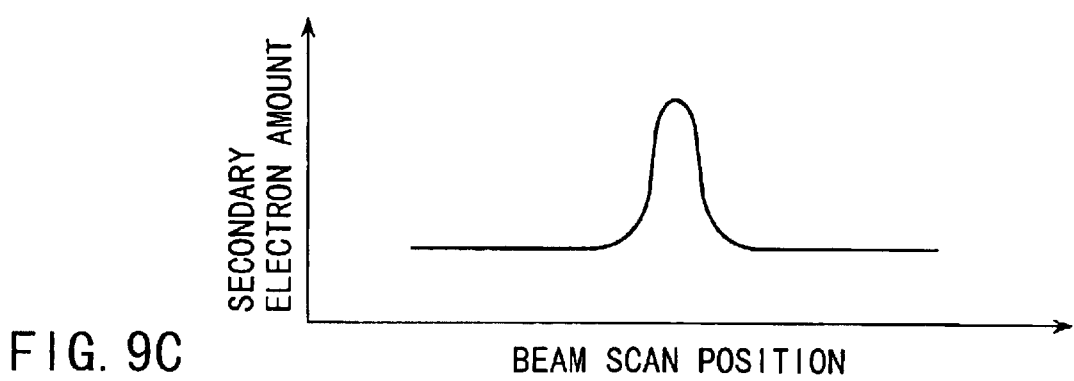

FIG. 9C shows the relationship between the secondary electron amount detected by the beam scan in this embodiment and the beam scan position. The abscissa indicates the beam scan position, and the ordinate the secondary electron amount. It is understood that an asymmetric waveform indicated by a broken line, which appears when the beam scan is made in the single direction, is eliminated and a symmetric waveform with respect to a vertical axis is obtained.

As has been described above, in the present invention, the same advantages as in the second embodiment are obtained. In addition, in this embodiment, since the beam scanning is performed alternately at symmetrical positions with respect to the underlying mark, the charging of the resist surface occurs uniformly. Therefore, the asymmetry of the obtained secondary-electron signal waveform relative to the mark is eliminated, and high-precision alignment is realized.

The present invention is not limited to the above embodiment.

In the above embodiment, the beam size is varied between the first beam radiation and second beam radiation. However, the same advantages as described above can be obtained when the acceleration voltage, beam current density, beam scan speed, beam scan position, beam shape, etc. are varied. Where the beam current density is varied, it is preferable that the current density in the second beam radiation is made less than that in the first beam radiation. Where the beam speed is varied, it is preferable that the beam speed in the second beam radiation is made higher than that in the first beam radiation.

Figure 11A:
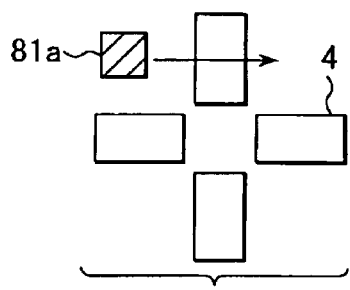
FIGS. 11A and 11B illustrate first and second beam radiations according to a modification of the present invention.
Figure 11B:
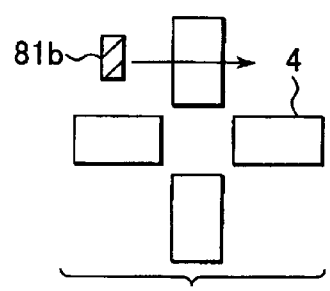

FIGS. 11A and 11B show an example of the case where the beam shape is varied. FIG. 11A illustrates the technical concept of the first beam radiation, and FIG. 11B illustrates the technical concept of the second beam radiation. As is shown in these figures, a second beam shape 81b is narrowed in the beam scan direction, compared to a first beam shape 81a.

Figure 12A:
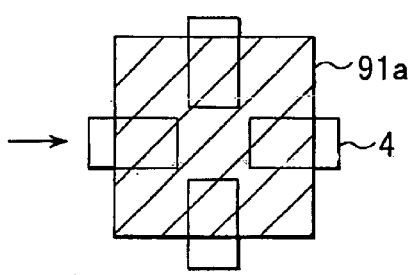
FIGS. 12A and 12B illustrate first and second beam radiations according to a modification of the present invention.
Figure 12B:
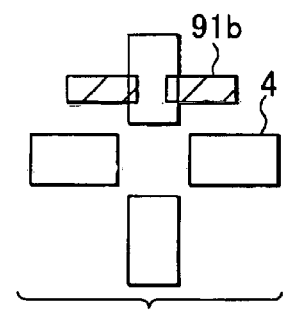

FIGS. 12A and 12B show an example of the case where the beam scan position is varied. FIG. 12A illustrates the technical concept of the first beam radiation, and FIG. 12B illustrates the technical concept of the second beam radiation. As is shown in these figures, a square area 91a having its center at the center of the underlying mark 4 is a beam radiation area for the first beam radiation. By contrast, a beam radiation area for the second beam radiation is only edge portions 91b of the underlying mark 4. Where the beam scan position is varied, for example, as shown in FIGS. 11A, 11B, 12A and 12B, the location at which the mark position is obtained by the second beam radiation (corresponding to the edge portions in this embodiment) needs to be present within the first beam radiation area.

Figure 13:
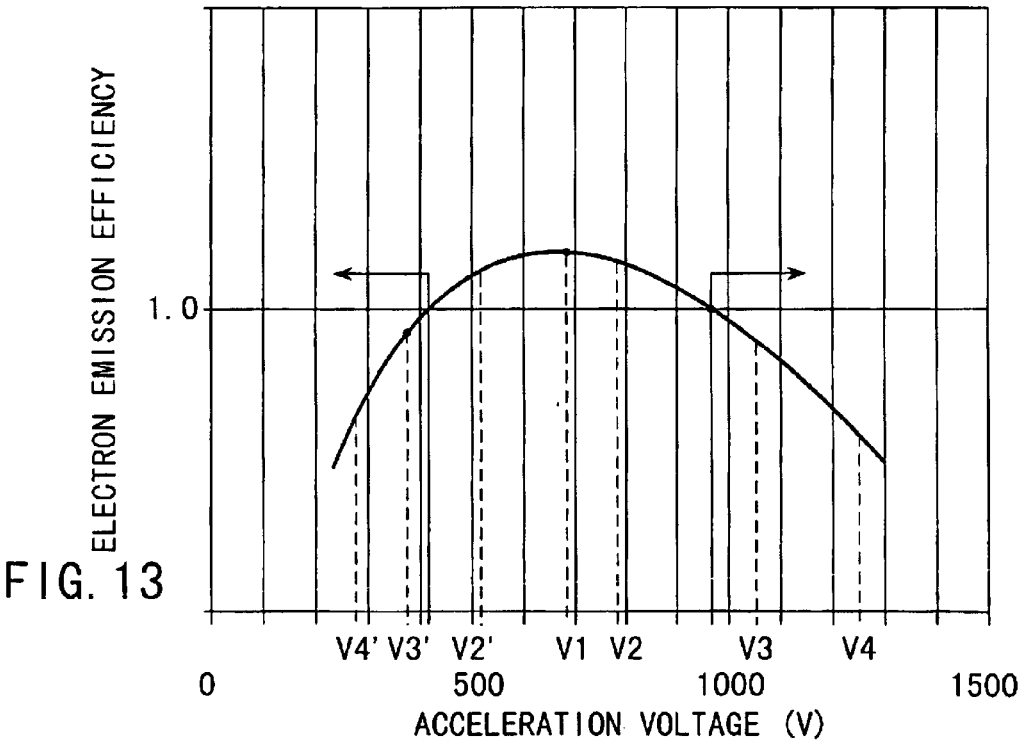
FIG. 13 is a graph showing a relationship between an acceleration voltage of an electron beam and an electron discharge efficiency of electrons discharged from the surface of the sample.

A preferable method in the case where the acceleration voltage is varied will now be described with reference to FIG. 13. Where the sample surface is to be positively charged, the acceleration voltage is set at v1 in the first beam radiation in the figure in order to charge the sample more on the positive side. In the second beam radiation, an acceleration voltage v2 or v2', at which the emission efficiency of secondary electrons is made less than in the first beam radiation, is selected. Thus, the increase in positive charge in the second beam radiation becomes gentler than in the first beam radiation, and high-precision mark detection can be made.

On the other hand, where the sample surface is to be negatively charged, the acceleration voltage is set at v4 or v4' in the first beam radiation in the figure in order to charge the sample more on the negative side. In the second beam radiation, an acceleration voltage v3 or v3', at which the emission efficiency of secondary electrons is made greater than in the first beam radiation, is selected. Thus, the increase in negative charge in the second beam radiation becomes gentler than in the first beam radiation, and high-precision mark detection can be made.

Needless to say, the modes of changing the various parameters are not limited to the above-described ones.

Other modifications may be made without departing from the spirit of the present invention.

(Fourth Embodiment)

Figure 14:
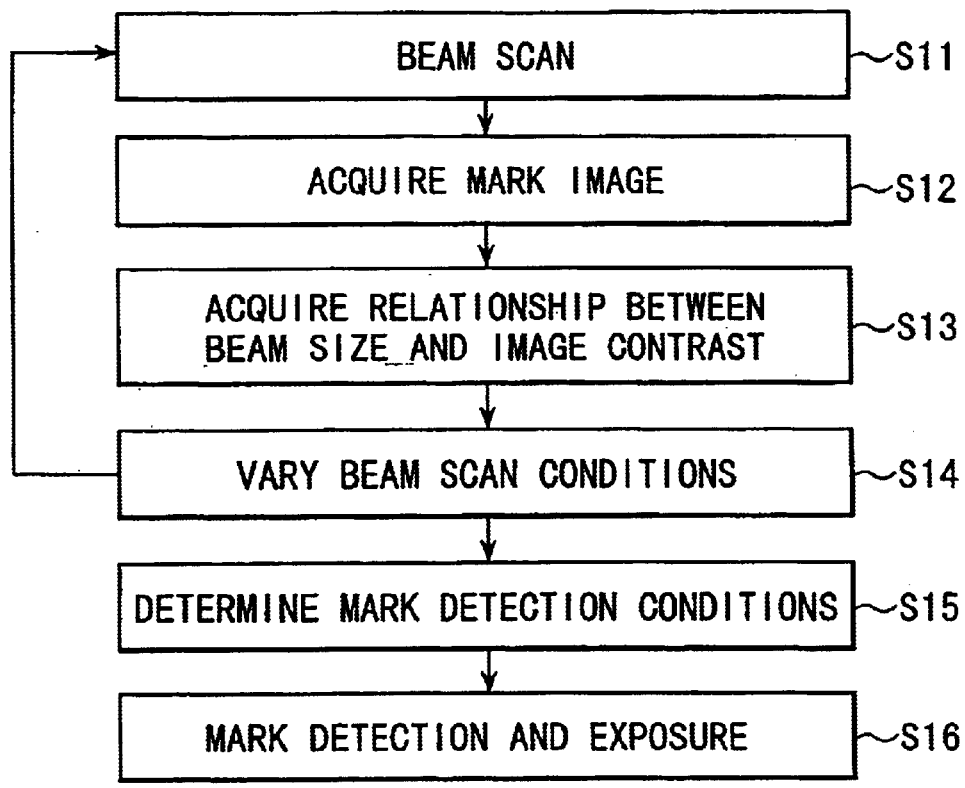
FIG. 14 is a flow chart illustrating an electron beam alignment exposure according to a fourth embodiment of the invention.

FIG. 14 is a flow chart of an electron beam alignment exposure according to a fourth embodiment of the invention. The fourth embodiment relates to optimization of beam radiation conditions for the electron beam alignment exposure in which the first beam radiation and second beam radiation are carried out.

The optimization of beam radiation conditions according to this embodiment will now be described with reference to FIG. 14.

To start with, mark scan is performed, based on preset beam scan conditions (S11). FIG. 15A shows beam shapes used in the mark scan. As is shown in FIG. 15A, the beam has a four-stage stepwise shape. This beam has four beam widths d1 to d4 in a direction perpendicular to the beam scan direction indicated by the arrow.

With the electron beam having this beam shape, the underlying mark 4 is scanned to obtain a mark image 4' (S12). As is understood from the mark image 4', the two stages (d1–d2) of the four beam widths d1 to d4, as counted from the widest one, can be detected as the mark image. However, the two narrower beam-width stages (d3–d4) cannot be detected as the mark image. This is also understood from a secondary electron waveform 111 (where the beam width is great) and a secondary electron waveform 112 (where the beam width is small) in FIG. 15A. In other words, in the case of the secondary electron waveform which is obtained where the beam width is large, it is understood that a sufficient amount of electrons are radiated on the sample surface and there is an adequate difference in secondary electron amount between the mark portion and the other portion. Where the beam width is small, the amount of electrons radiated on the sample surface is not sufficient, and there is little difference in secondary electron amount between the mark portion and the other portion.

Subsequently, on the basis of the obtained mark image 4', a curve representing the relationship between the beam size and the S/N of signal waveform under the beam scan conditions is found (S13). FIG. 15B shows the obtained curve representing the relationship. The abscissa indicates the beam size and the ordinate the S/N of the signal waveform.

On the basis of the obtained curve representing the relationship, the beam radiation time is varied so as to obtain a good S/N, i.e. the image contrast (S14). The steps (S11–S13) are repeated until the optimal image contrast is obtained.

Then, the optimal beam size and beam radiation time, with which the optimal image contrast has been obtained, are set as mark detection conditions (S15). On the basis of these detection conditions, the mark detection is performed (S16). The mark detection in this context refers to the first and second beam radiations in the first to third embodiments. Thereafter, like the firs t third embodiments, the alignment exposure is effected on the basis of the obtained mark position.

The advantageous effect obtained by the beam optimization will now be described. Where the parameters of the beam area, beam scan speed, beam scan pitch and beam current are varied one by one, if each parameter is varied with four values, it is necessary to scan with respect to all parameters by $4^4$=256 beam radiations. By contrast, if the four kinds of beam width are provided in the direction perpendicular to the beam scan direction in order to perform the mark scan, as in the present embodiment, a single scan operation is regarded to detect four kinds of the charge amount per unit area. Accordingly, it should suffice if the number of kinds of beam radiation is 64. Therefore, the optimization of the beam scan conditions can be quickly carried out.

In the present embodiment, the stepwise beam shape is adopted. However, as shown in FIGS. 15C and 15D, a triangular beam shape or a quadrantal beam shape may be adopted. The present invention is applicable to beam shapes having a plurality of beam widths in a direction perpendicular to the beam scan direction.

(Fifth Embodiment)

The first to fourth embodiments are directed to the cases where the present invention is applied to the alignment exposure. A fifth embodiment is directed to a case where this invention is applied to a misalignment measurement using an SEM (Scanning Electron Microscope). In this embodiment, the acceleration voltage is 2 kV.

Figure 16A:
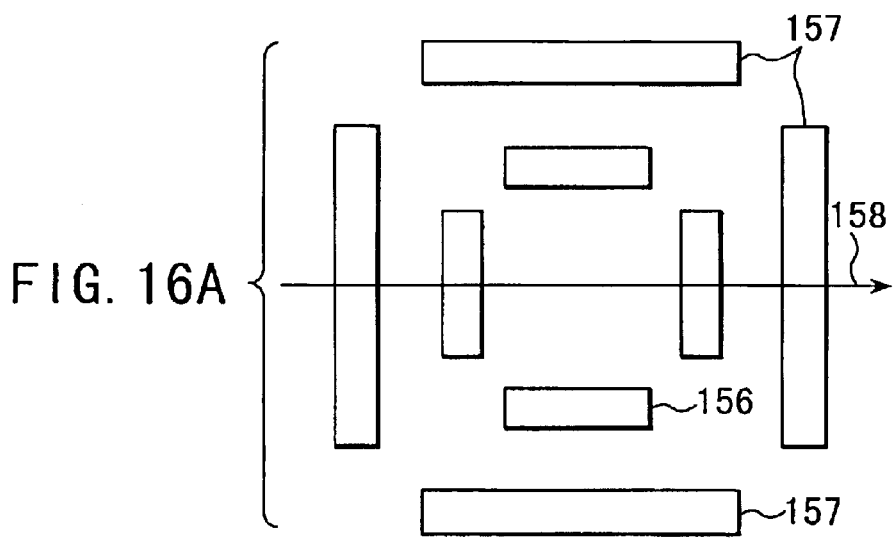
FIGS. 16A to 16C illustrate an electron beam misalignment measurement according to a fifth embodiment of the present invention.
Figure 16B:
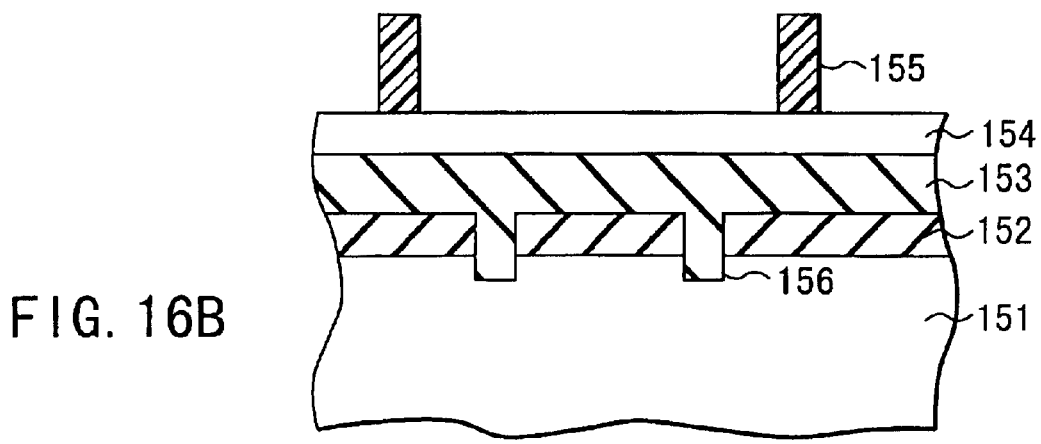

FIGS. 16A and 16B show the structure of a sample to be measured in the fifth embodiment. FIG. 16A is a plan view and FIG. 16B is a cross-sectional view.

As is shown in FIG. 16A, four linear first marks 156 are disposed at positions corresponding to four sides of a square. Each pair of two opposed first marks 156 are parallel, and adjacent two first marks 156 are disposed at right angles with each other. Four linear second marks 157 are disposed at positions corresponding to four sides of a square which is greater than the square with the four sides to which the positions of the four linear first marks 156 correspond. The second marks 157 are designed to have a planar structure whose center coincides with the center of the first marks 156 serving as the underlying marks.

FIG. 16B shows cross-sectional structures of the first marks 156 and second marks 157. A silicon nitride film 152 is formed on a silicon substrate 151. Recess portions are performed to penetrate the silicon nitride film 152 so as to reach the inside of the silicon substrate 151. A silicon oxide film 153 is formed over the silicon nitride film 152 including the recess portions. An antireflection film 154 is formed on the silicon oxide film 153. A photoresist 155 is selectively formed on the antireflection film 154. The silicon oxide film 153 buried in the recess portions functions as the first marks 156, and the selectively formed photoresist 155 functions as the second marks 157.

Figure 17:
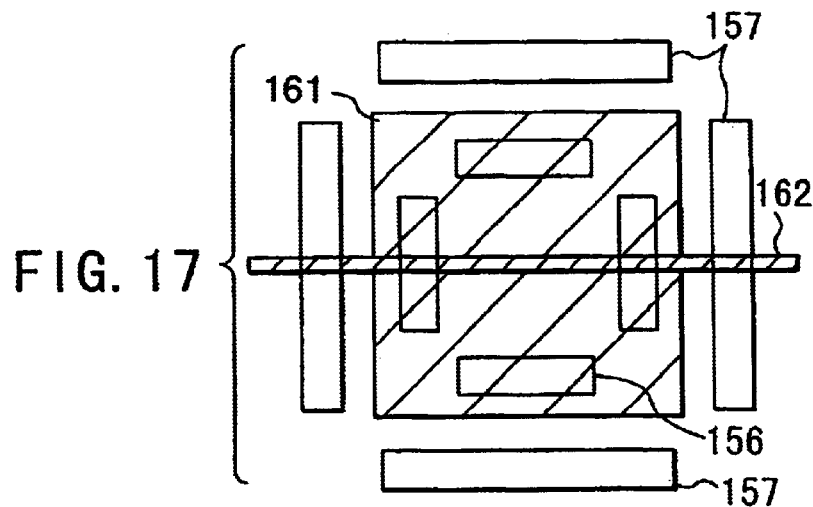
FIG. 17 illustrates a technical concept of the misalignment measurement according to the fifth embodiment of the invention.

The sample (substrate) is conveyed into a sample chamber of the SEM. The first and second marks 156 and 151 are shifted into the electron beam deflection region of the SEM. Then, first electron beam radiation is performed, with the observation magnification set at 10,000, the beam current at 10 pA, and the scan frequency at 1 kHz. The first beam radiation area corresponds to an area 161 in FIG. 17. As is shown in FIG. 17, the first marks 156 formed at positions deep from the surface of the silicon substrate 1 and the vicinity thereof alone are charged.

Figure 16C:
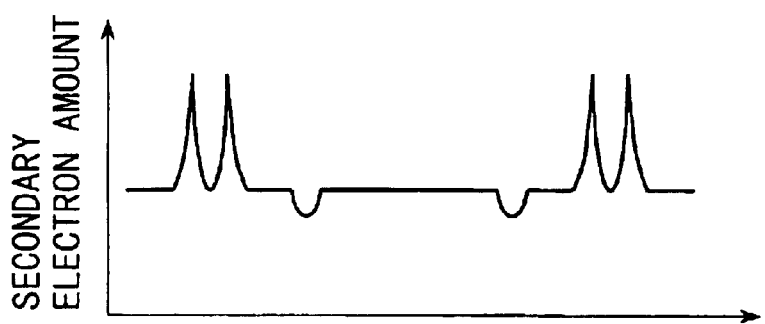

Second electron beam radiation is performed, with the observation magnification set at 5,000, the beam current at 5 pA, and the scan frequency at 1 kHz. The second beam radiation area corresponds to an area 162 in FIG. 17. In the second beam radiation, the first marks 156 and the second marks 157 formed of photoresist are scanned at a time. FIG. 16C shows a secondary-electron signal waveform obtained by the second beam radiation. The abscissa indicates the beam scan position, and the ordinate the secondary electron amount. Based on the obtained secondary-electron signal waveform, a relative positional error between the first marks 156 and second marks 157 is measured, whereby misalignment can be measured.

As has been described above, the beam radiation step is divided into a first beam radiation step and a second beam radiation step. The sample surface is charged with the first beam radiation, and the beam is scanned by the second beam radiation to acquire the mark image on the sample surface. Thereby, high-precision mark image detection can be performed.

In the first beam radiation, the beam current is set at 10 pA and a portion of the resist surface which overlaps the first marks 156 is sufficiently charged. Thus, an adequate potential contrast is produced between the portion on the marks 156 and the other portion. Accordingly, where the mark image is obtained by the second beam radiation with the beam current set at 5 pA, high-speed, high-precision mark image detection can be performed. In particular, detection of the mark image is not performed in the undesirable condition with a low potential contrast due to deficient charging.

In the present embodiment, in the first beam radiation, the observation magnification is set at 10,000 and the vicinity of the first marks 156 alone is charged. In the second beam radiation, the observation magnification is set at 5,000. Thereby, the first and second marks 156 and 157 are scanned at a time. However, in the first beam radiation, the second marks 157 are not scanned by the beam. Thus, when the second mark image is to be acquired, there is no adverse effect. Therefore, high-precision misalignment measurement can be performed.

In the above described embodiment, in the first beam radiation and the second beam radiation, the beam current is varied. However, the same advantages as described above can be obtained when other parameters such as the beam scan speed, beam size, beam current density, beam scan position and beam shape are varied.

(Sixth Embodiment)

Figure 18A:
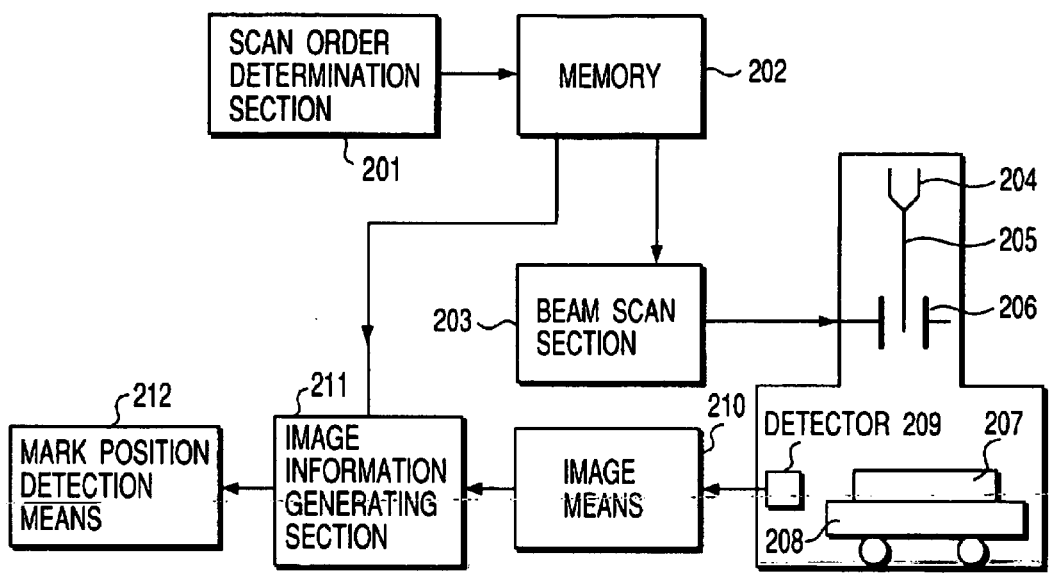
FIGS. 18A to 18E are views for describing a pattern observation method according to a sixth embodiment of the present invention.

A sixth embodiment of the invention relates to a modification of the first embodiment. The sixth embodiment is characterized in that an electron beam is made to scan a sample at random to observe a pattern. FIG. 18A shows a whole structure of an electron beam exposure apparatus used in the sixth embodiment of the invention.

As is shown in FIG. 18A, a deflector 206 is disposed on a path of an electron beam 205 emitted from an electron gun 204. The electron beam 205 deflected by the deflector 206 is let to fall on a sample 207 placed on a stage 208. The electron gun 204, deflector 206, sample 207 and stage 208 are contained within an exposure chamber 213.

A scan order determination section 201 determines the order of scan of the electron beam 205 over the sample 207. A scan area of this exposure apparatus comprises, for instance, 512 pixels in each of X- and Y-directions. In this case, the total number of pixels is 512×512. Each pixel is expressed by (X, Y). At first, a first radiation position is extracted at random from the pixels. For instance, (X, Y)=(32, 432) is extracted. A second radiation position is similarly extracted at random. In this way, the radiation positions are extracted repeatedly until the (512×512)-th radiation position. The radiation position is extracted so as not to overlap the previously extracted one. Thus, the scan order information for irradiating all the (512×512) pixels at random is obtained. The scan order information is expressed by two parameters, i.e. a scan order and a scan position.

The determined scan order information is delivered to a memory 202, and the memory 202 stores it. The scan order may be determined each time the scan is performed, or the scan order may be determined in advance and stored in the memory 202. The scan order information in the memory 202 is output to a beam scan section 203. The beam scan section 203 controls the deflector 206 on the basis of the scan order information. Thereby, a voltage corresponding to the radiation position is applied to the deflector 206. Thus, the electron beam 205 is deflected, and the electron beam 205 is made to scan a desired position on the sample 207. The scan order information in the memory 202 is output to an image information generating section 211.

A detector 209 detects secondary electrons from the surface of the sample 207, and produces a detection signal. The detection signal is output to an image memory 210. The image memory 210 stores the detection signal from the detector 209 as one-dimensional detection information and outputs the one-dimensional detection information to the image information generating section 211.

The image information generating section 211 generates two-dimensional image information on the basis of the scan order information from the memory 202 and the one-dimensional detection information from the image memory 210. More specifically, the image information generating section 211 rearranges the one-dimensional detection information according to the operational order. Thereby, the two-dimensional image information on the surface of the sample 207, which does not depend on the scan order, is obtained. The obtained two-dimensional image information is output to mark position detection means 212. The mark position detection means 212 detects the mark position by an ordinary image process.

According to the exposure apparatus, as described above, the electron beam can be made to scan the pattern in the scan area at random. The signal obtained by the random scan is processed to produce image information corresponding to the two-dimensional image of the sample surface. Thus, the mark image on the sample 207 can be acquired. In addition, an asymmetric signal waveform occurring due to a scan direction can be prevented, and as a result high-precision pattern position detection and sample observation can be carried out. In the present embodiment, the random scan is carried out. However, the exposure apparatus of this embodiment is applicable to a reciprocal beam scan as in the third embodiment.

An exposure method using the above exposure apparatus will now be described. In the exposure apparatus of this embodiment, the number of pixels is 512×512, as mentioned above, and the scan area is 5.12 $\mu$m. For easier understanding, however, it is assumed that the number of pixels is 3×3.

Figures 18B, 18C:
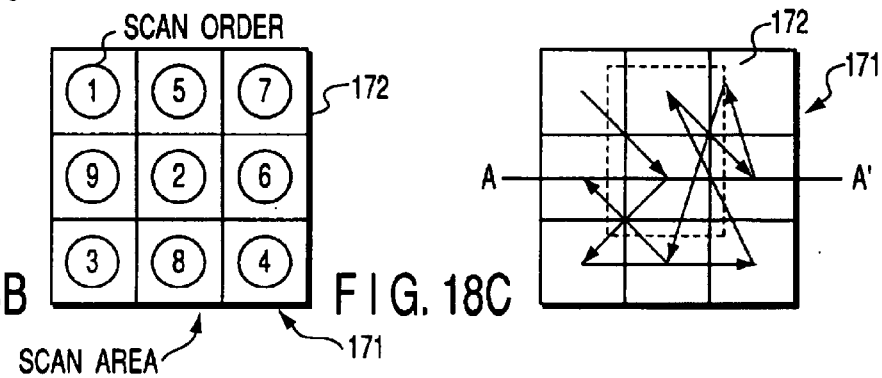
Figure 18D:
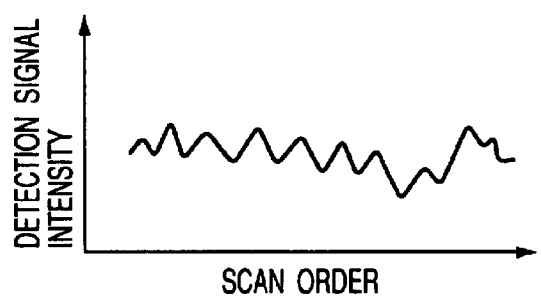
Figure 18E:
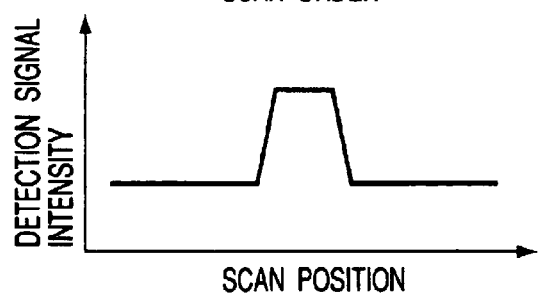

The scan order determination section 201 determines, for instance, a scan order illustrated in FIG. 18B. Reference numeral 171 denotes a scan area, and 172 denotes pixels. Numbers indicated in the respective pixels indicate a scan order. FIG. 18C illustrates an actual scan procedure. The electron beam is made to scan the pixels in the order indicated by arrows. A broken line indicates the position of the mark. FIG. 18D shows a signal waveform obtained by randomly scanning the electron beam. The abscissa indicates the scan order and the ordinate the detection signal intensity. On the basis of the thus obtained detection signal and scan order information, the image information generating section 211 generates image information. FIG. 18E shows two-dimensional image information thus generated by the image information generating section 211, which is extracted from the cross-sectional area indicated by line A–A' in FIG. 18C. The abscissa indicates the scan position and the ordinate the detection signal intensity. As is understood from FIG. 18E, the information reflecting the mark position is obtained by rearranging the information on the detection signal intensity in the order of scan positions.

In the ordinary scan, an asymmetrical component occurs due to the beam scan direction. In the present embodiment, however, since the random scan is performed, an image free from asymmetrical component can be obtained. As a result, high-precision sample observation and pattern position detection can be achieved.

In the above embodiment, a two-dimensional image is obtained by a two-dimensional scan. However, a one-dimensional signal waveform may be obtained by a one-dimensional scan.

The present invention is not limited to the above-described embodiments.

In the embodiments, the acceleration voltage for pattern exposure is set at 1 kV or 5 kV. This invention, however, is applicable to cases where pattern exposure is effected with the acceleration voltage of 50 kV or more. In this invention, the type of the electron beam exposure apparatus is not limited. The invention is applicable to, for instance, a partial one-time exposure type electron beam exposure apparatus, a variable formation type electron exposure apparatus, a multi-beam type electron beam exposure apparatus, a circular beam type electron beam exposure apparatus, and a one-time exposure type electron beam exposure apparatus. Needless to say, a substance radiated on the sample is not limited to an electron beam, and it may be an ion beam, charged particles, etc. The present invention relating to the misalignment measurement is applicable not only to exposure apparatus, but also to electron microscopes, etc.

As has been described above in detail, according to the present invention, in the alignment exposure or misalignment measurement using the charging phenomenon, the alignment exposure beam radiation step is divided into a beam radiation step for charging and a beam radiation step for mark detection. The beam radiation steps are carried out under different conditions. Thus, mark image detection is performed with higher precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern observation apparatus comprising:
    a table generating section for generating a table in which a scan order is associated with scan positions, wherein the table generating section generates the table by selecting the scan positions at random according to the scan order;
    a charged particle beam scanning mechanism for scanning, according to the table, a charged particle beam over a sample on which a pattern is formed;
    a detection mechanism for detecting secondary electrons produced from the sample by the scanning of the charged particle beam, and outputting secondary electron detection signals;
    an image information generating section for rearranging the secondary electron detection signals in association with the scan positions on the basis of the table, thereby generating image information of a surface of the sample; and
    a pattern position determination section for determining a pattern position on the basis of the image information.

2. A pattern observation apparatus according to claim 1, wherein said table has a first scan procedure and a second scan procedure, and
    a locus of the charged particle beam scanned by the second scan procedure is substantially equal to a locus of the charged particle beam scanned by the first scan procedure, and both loci are reverse to each other.

3. A pattern observation apparatus according to claim 1, further comprising a charged particle beam exposure section for effecting an alignment exposure of a desired pattern, on the basis of the pattern position determined by the pattern position determination section.

4. A pattern observation apparatus according to claim 1, wherein said sample has a first mark formed in a substrate and a second mark formed on a surface of the substrate, the first and second marks serving as a reference for alignment exposure, and
    the pattern observation apparatus further comprises relative position measuring means for measuring a relative position of the first mark and the second mark.

5. A pattern observation method comprising the steps of:
    generating a table in which a scan order is associated with scan positions;
    scanning a charged particle beam over a sample according to the table, wherein the table is generated by selecting the scan positions at random according to the scan order, whereby the charged particle beam is made to scan the sample at random;
    detecting secondary electrons produced from the sample by the scanning of the charged particle beam, and outputting secondary electron detection signals;
    rearranging the secondary electron detection signals in association with the scan positions on the basis of the table, thereby generating image information of a surface of the sample; and
    determining a pattern position on the basis of the image information.

6. A pattern observation method according to claim 5, wherein said table has a first scan procedure and a second scan procedure, and
    a locus of the charged particle beam scanned by the second scan procedure is substantially equal to a locus of the charged particle beam scanned by the first scan procedure, and both loci are reverse to each other.

7. A pattern observation method according to claim 5, further comprising a step of effecting an alignment exposure of a desired pattern on the basis of the pattern position determined by the pattern position determination section.

8. A pattern observation method according to claim 5, wherein said sample has a first mark formed in a substrate and a second mark formed on a surface of the substrate, the first and second marks serving as a reference for alignment exposure, and
    the pattern observation method further comprises a step of measuring a relative position of the first mark and the second mark.

9. A pattern observation apparatus according to claim 1, wherein
    the charged particle beam scanning mechanism performs a first charged particle beam radiation on the sample to charge a surface of the sample, and performs a second charged particle beam radiation on the sample to scan the charged particle beam over the pattern.

10. A pattern observation method according to claim 1, wherein
    the scanning of the charged particle beam includes: performing a first charged particle beam radiation on the sample with a charged particle beam radiating apparatus, thereby charging a surface of the sample; and performing a second charged particle beam radiation on the sample with the charged particle beam radiating apparatus, thereby scanning the charged particle beam over the pattern.

* * * * *